United States Patent
Chen et al.

(10) Patent No.: US 7,289,322 B2
(45) Date of Patent: Oct. 30, 2007

(54) HEAT SINK

(75) Inventors: Chun-Chi Chen, Shenzhen (CN); Shih-Hsun Wung, Shenzhen (CN); Guang Yu, Shenzhen (CN); Da-Yuan Zhou, Shenzhen (CN); Jin-Biao Liu, Shenzhen (CN)

(73) Assignees: Fu Zhun Precision Industry (Shen Zhen) Co., Ltd., Longhua Town, Bao An District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 123 days.

(21) Appl. No.: 11/163,573

(22) Filed: Oct. 24, 2005

(65) Prior Publication Data

US 2007/0091568 A1    Apr. 26, 2007

(51) Int. Cl.
*H05K 7/20* (2006.01)

(52) U.S. Cl. .................. 361/695; 361/696; 361/697; 361/710; 361/719; 165/80.3; 165/104.21; 165/104.33; 257/721; 257/722; 174/16.3

(58) Field of Classification Search ........ 361/683–687, 361/690–697, 703–724; 165/80.3, 104.33, 165/104.34, 121–126, 185, 104.21; 257/706–727; 174/16.3, 15.2
See application file for complete search history.

(56) References Cited

U.S. PATENT DOCUMENTS

| 5,709,263 | A | 1/1998 | Mira |
| 5,740,014 | A | 4/1998 | Lin |
| 6,199,624 | B1 | 3/2001 | Wotring |
| 6,301,110 | B1 | 10/2001 | Kodaira |
| 6,745,824 | B2 * | 6/2004 | Lee et al. ............. 165/104.14 |
| 6,967,845 | B2 * | 11/2005 | Chiang et al. .......... 361/709 |
| 7,089,999 | B1 * | 8/2006 | Wu et al. ............... 165/80.3 |
| 7,139,171 | B2 * | 11/2006 | Wang et al. ............. 361/695 |
| 2003/0024687 | A1 | 2/2003 | Cheng et al. |

FOREIGN PATENT DOCUMENTS

| JP | 2000022054 A | * | 1/2000 |
| JP | 02003023128 A | * | 1/2003 |

* cited by examiner

*Primary Examiner*—Michael Datskovskiy
(74) *Attorney, Agent, or Firm*—Winston Hsu

(57) ABSTRACT

A heat sink includes a fin assembly (20) including a plurality of fin plates (22) and a fan (30) mounted on the fin assembly. Each fin plate includes a plurality of cutouts (226) defined on one edge thereof, and the cutouts of the fin plates cooperatively form a scraggy surface when the fin plates are assembled together. Airflow produced by the fan directly impinges on the scraggy surface thereby enhancing heat transferring between the fin plates and the airflow.

11 Claims, 8 Drawing Sheets

HEAT SINK

FIELD OF THE INVENTION

The present invention relates to a heat sink for removing heat from heat-generating electronic devices, and more particularly to a fin assembly of a heat sink with plate-like fins.

DESCRIPTION OF RELATED ART

When a CPU of an electronic apparatus, for example, a computer is operated, heat must be quickly carried away from the CPU so that the operation of the CPU can be maintained normal. A conventional heat dissipating apparatus for this purpose generally includes a heat sink having a plurality of upright fins and adapted for mounting on a top of the CPU, and a fan adapted for mounting on the heat sink above the CPU. To provide an optimal heat transfer, the heat sink is designed to have, generally, a large surface area. The size of the surface area of a heat sink can generally determine the heat dissipating capacity of a heat sink. One way to increase the surface area of the heat sink is to increase the length of the fins; however, to increase the length of the fins also increases a thickness of a border layer of air on a top surface of the fins. A border layer of air is a layer of stagnant air formed on a surface of an article. Typically, when a surface of the heat sink is flatter, a thicker border layer is formed on the surface. The thickness of the border layer of air is inversely proportional to the amount of heat that can be transferred from the surface of the heat sink to the surrounding air. Therefore, the increase of the heat dissipating efficiency by increasing the length of the fins of the conventional heat dissipating apparatus has its limitation.

SUMMARY OF INVENTION

Accordingly, what is needed is a heat sink which can efficiently carry heat away from a heat generating component. More specifically, what is needed is a heat sink having heat-dissipating fins wherein each fin has a specially configured edge adjacent a fan so that a thickness of a border layer of air on a surface cooperatively formed by the edges is reduced to facilitate an airflow generated by the fan to have a sufficient contact with the fins to thereby take heat away from the fins effectively.

A heat sink in accordance with a preferred embodiment of the present invention comprises a fin assembly comprising a plurality of fin plates and a fan mounted on the fin assembly. Each fin plate comprises a plurality of cutouts defined on one edge thereof, and the cutouts of the fin plates cooperatively form a scraggy surface when the fin plates are assembled together. The fan is mounted on the scraggy surface of the fin plates. Airflow produced by the fan directly impinges on the scraggy surface thereby enhancing heat transferring between the fin plates and the airflow.

Other advantages and novel features of the present invention will become more apparent from the following detailed description when taken in conjunction with the accompanying drawings, in which:

DETAILED DESCRIPTION

Figure 1:
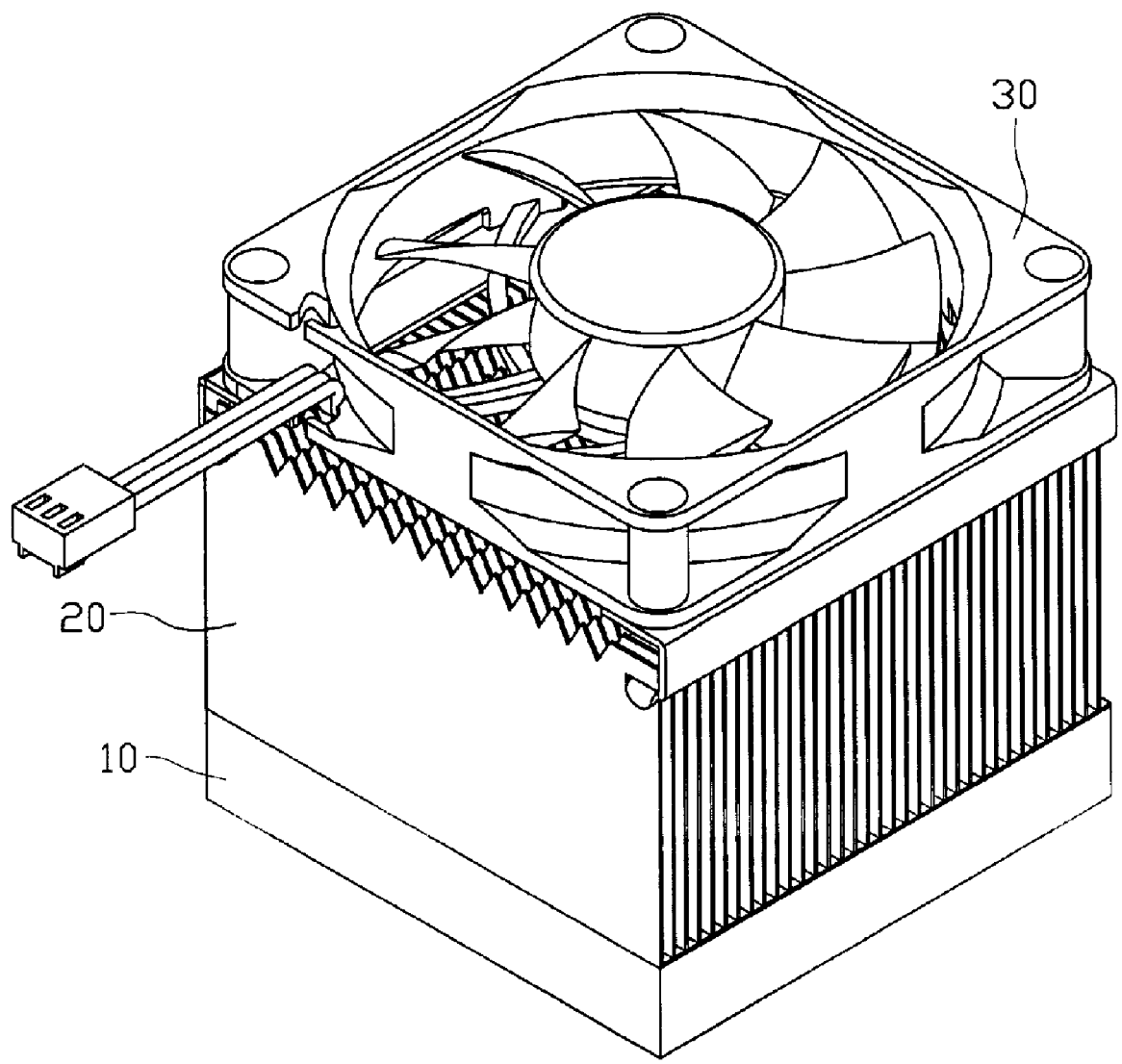
FIG. 1 shows an assembly view of a heat sink in accordance with a first preferred embodiment of the present invention.
Figure 2:
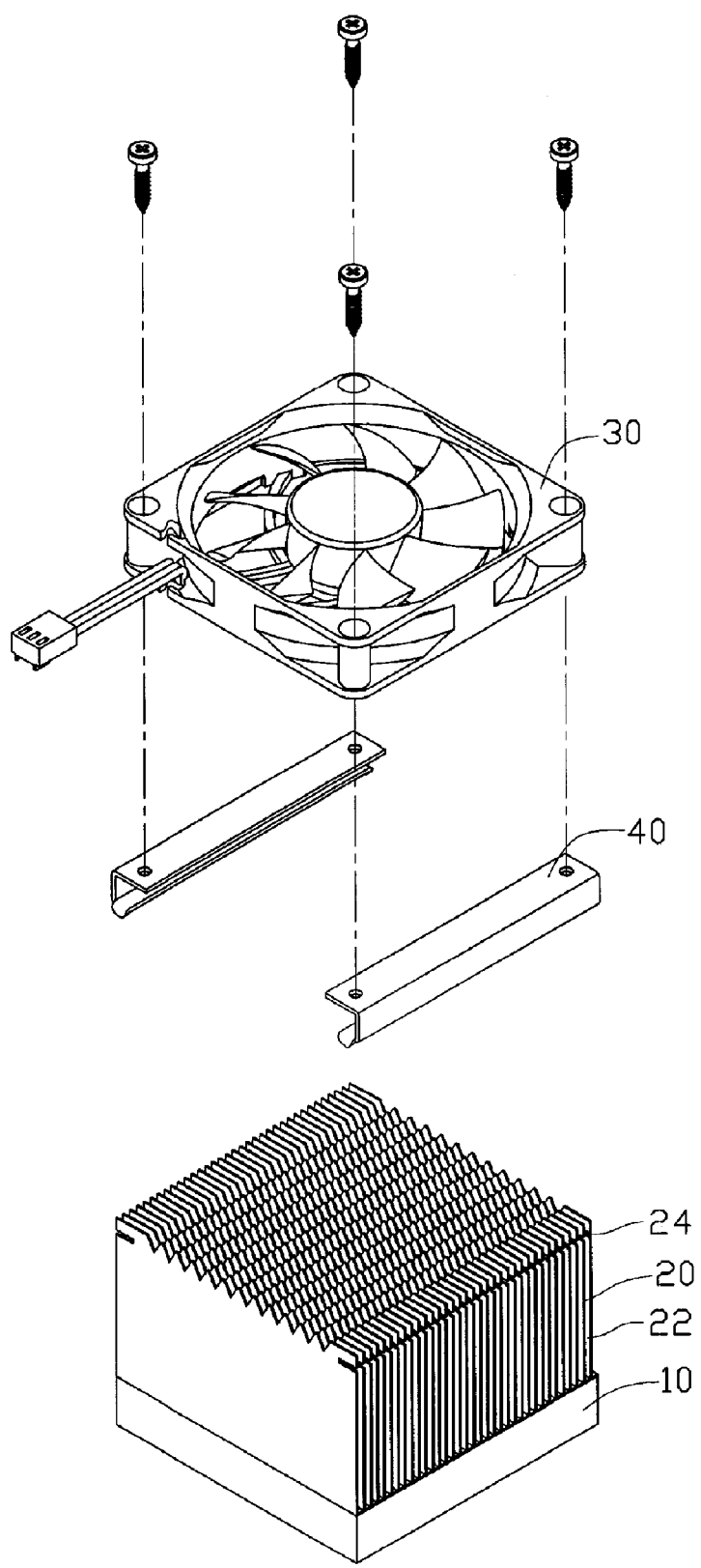
FIG. 2 is an exploded view of the heat sink of FIG. 1.

Referring to FIGS. 1-2, a heat sink in accordance with a first preferred embodiment of the present invention comprises a base 10, a fin assembly 20 arranged on the base 10, and a fan 30 attachable to a top surface of the fin assembly 20 to blow cooling air downwards passing through the fin assembly 20.

The base 10 is made of a heat conductive material, such as copper or aluminum. The base 10 has a bottom surface for contacting a heat generating component (not shown) and an upper surface opposite to the bottom surface.

Figure 3:
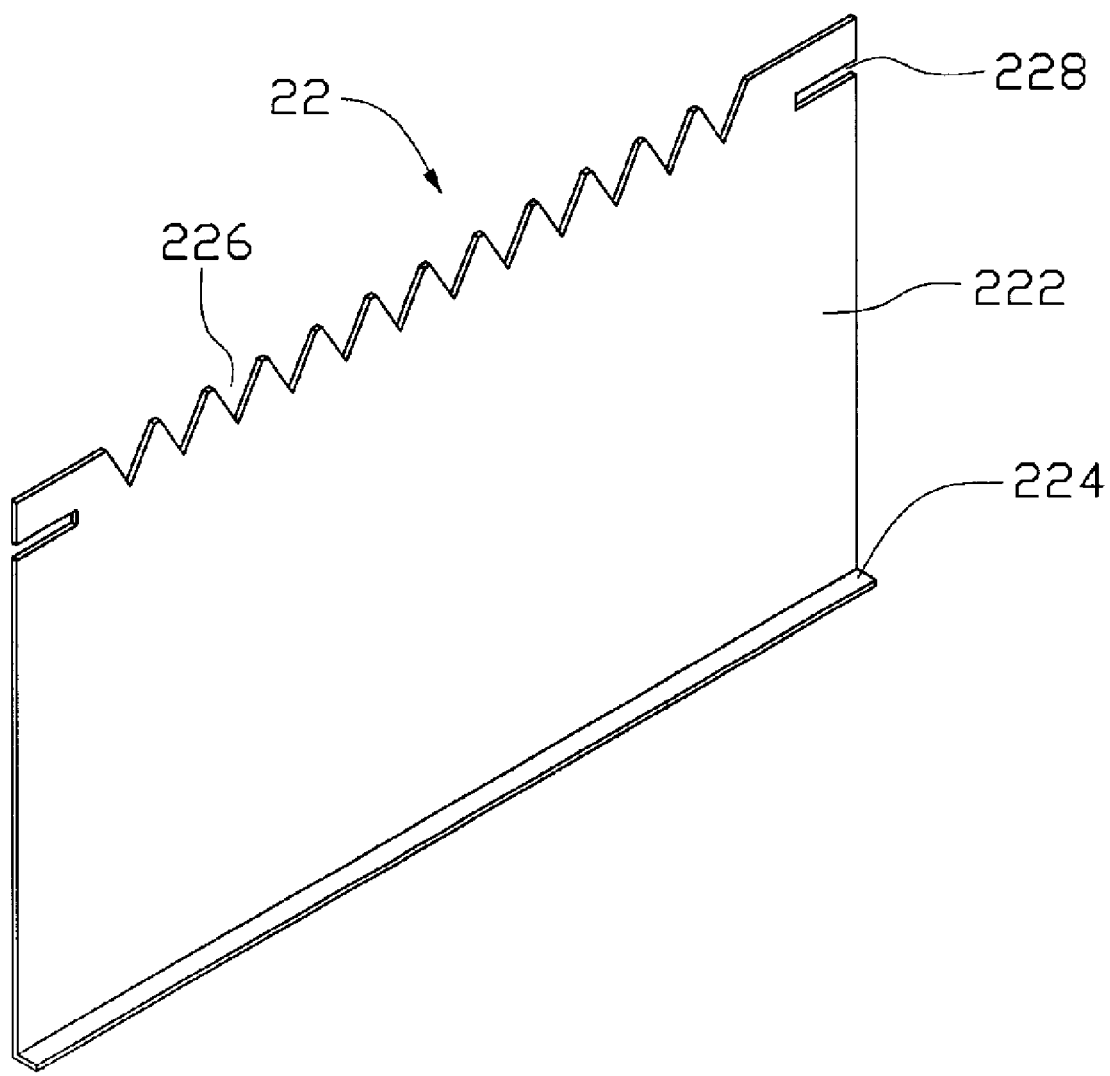
FIG. 3 is an enlarged view of a fin plate of the heat sink of FIG. 1.

The fin assembly 20 comprises a plurality of individual fin plates 22 arranged side by side. Referring to FIG. 3, each fin plate 22 comprises a main body 222 and a flange 224 extends perpendicularly from a bottom edge of the main body 222. The flanges 224 are coplanar with each other. The fin assembly 20 can be mounted on the upper surface of the base 10 with the flanges 224 being soldered or glued thereto. The flanges 224 are formed to also facilitate the fin plates 22 to be spaced from each other when they are mounted on the base 10 so that a plurality of air passageways can be defined between the fin plates 22. A pair of slots 228 is formed in top portion of opposite sides of the main body 222. The slots 228 at respectively opposite sides of the main body 222 align with each other thereby forming two grooves 24 on opposite sides of the fin assembly 20. A fan holder 40 engages within the grooves 24 so that the fan holder 40 is securely mounted on the fin assembly 20. Four screws (not labeled) are used for coupling the fan 30 and the fan holder 40 together; thus, the fan 30 is securely mounted on the top surface of the fin assembly 20. A plurality of triangle-shaped cutouts 226 is defined in top edge of each fin plate 22 so that the top edge appears as a sharp-toothed edge. However, the cutouts 226 are not limited to be triangle-shaped as described in the preferred embodiment; they can have other shapes; for example, they can be rectangle-shaped or trapezoid-shaped.

When the fin plates 22 are assembled together, the top surface of the fin assembly 20 is scraggy rather than flat due to the cutouts 226. Airflow produced by the fan 30 directly impinges on the scraggy surface of the fin assembly 20. The velocity of the airflow is disturbed and turbulence of the airflow between the fin plates 22 is increased. Therefore, the border layer of air on the top surface of the fin assembly 20 is perturbed and becomes thin along the direction of airflow thereby enhancing heat transferring between the fin plates 22 and the airflow. The heat dissipation capability of the heat sink is improved. Additionally, the cutouts 226 defined in each of the fin plates 22 can efficiently reduce weight of the whole heat sink.

Figure 4:
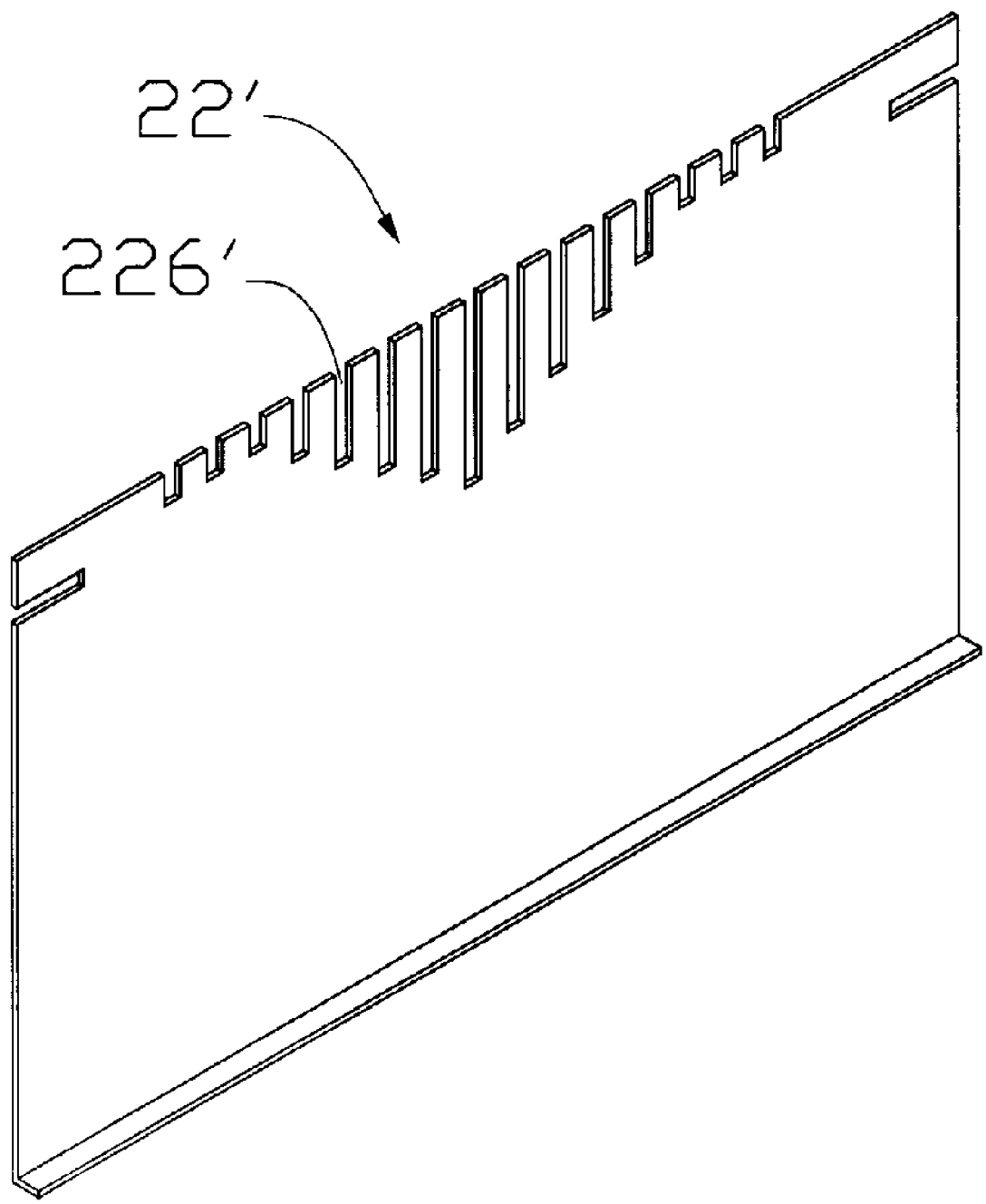
FIG. 4 is similar to FIG. 3, but showing the fin plate having a different arrangement of cutouts in a top thereof.

FIG. 4 shows an alternative fin plate 22'. The structure of the fin plate 22' is similar to that of the fin plate 22 as described above. The main difference is that the cutouts 226' are rectangle-shaped instead of triangle-shaped, and the cutouts 226' have different depths. The depths of the cutouts 226' near center of the fin plate 22' are deeper than that of cutouts 226' away from the center. The depths of the cutouts 226' gradually increase from two sides toward the center of the fin plate 22'. The airflow would increase in the center part of the fin assembly, which in turn would enhance heat transport.

Figure 5:
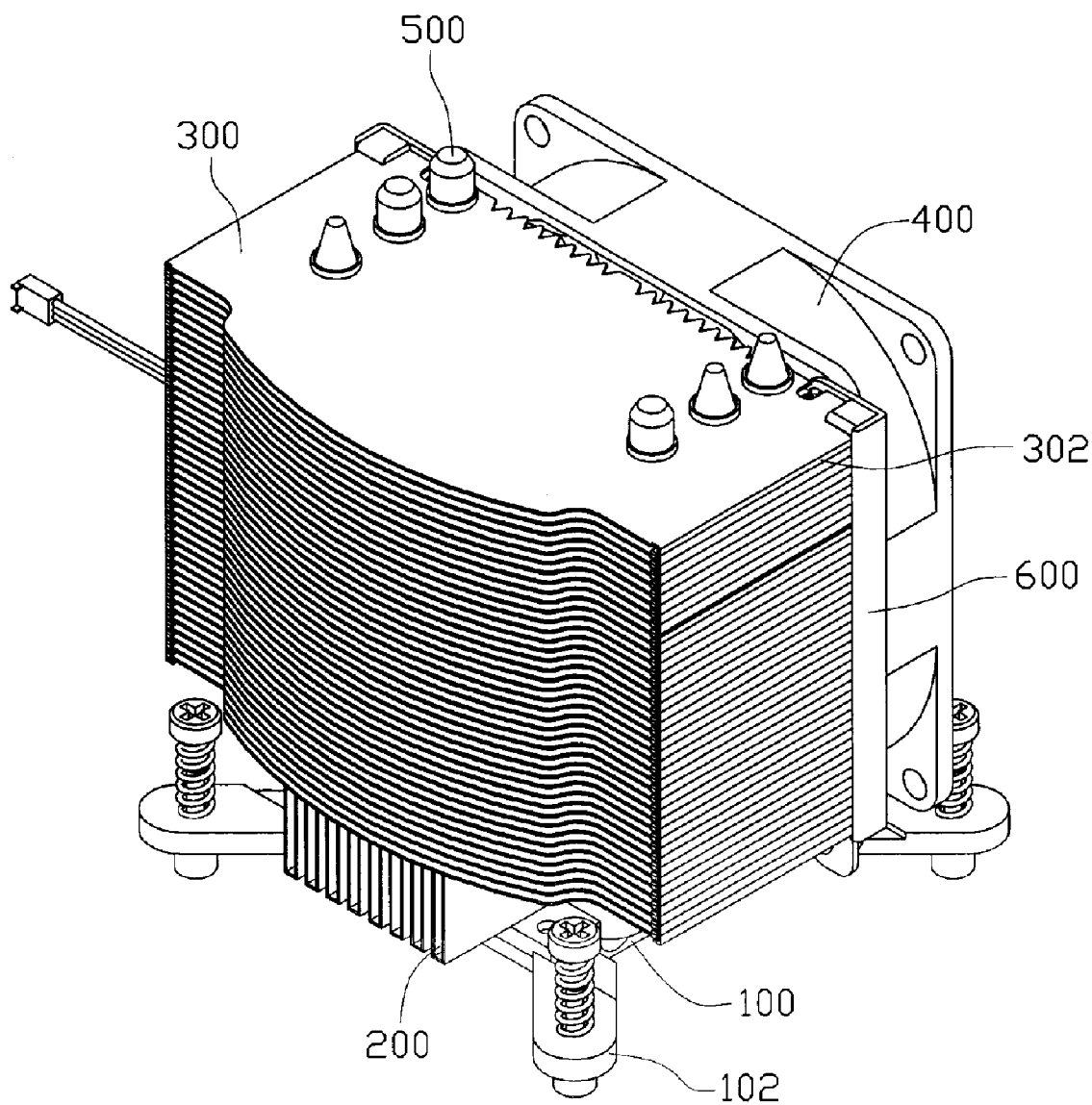
FIG. 5 shows an assembly view of a heat sink in accordance with a second preferred embodiment of the present invention.
Figure 6:
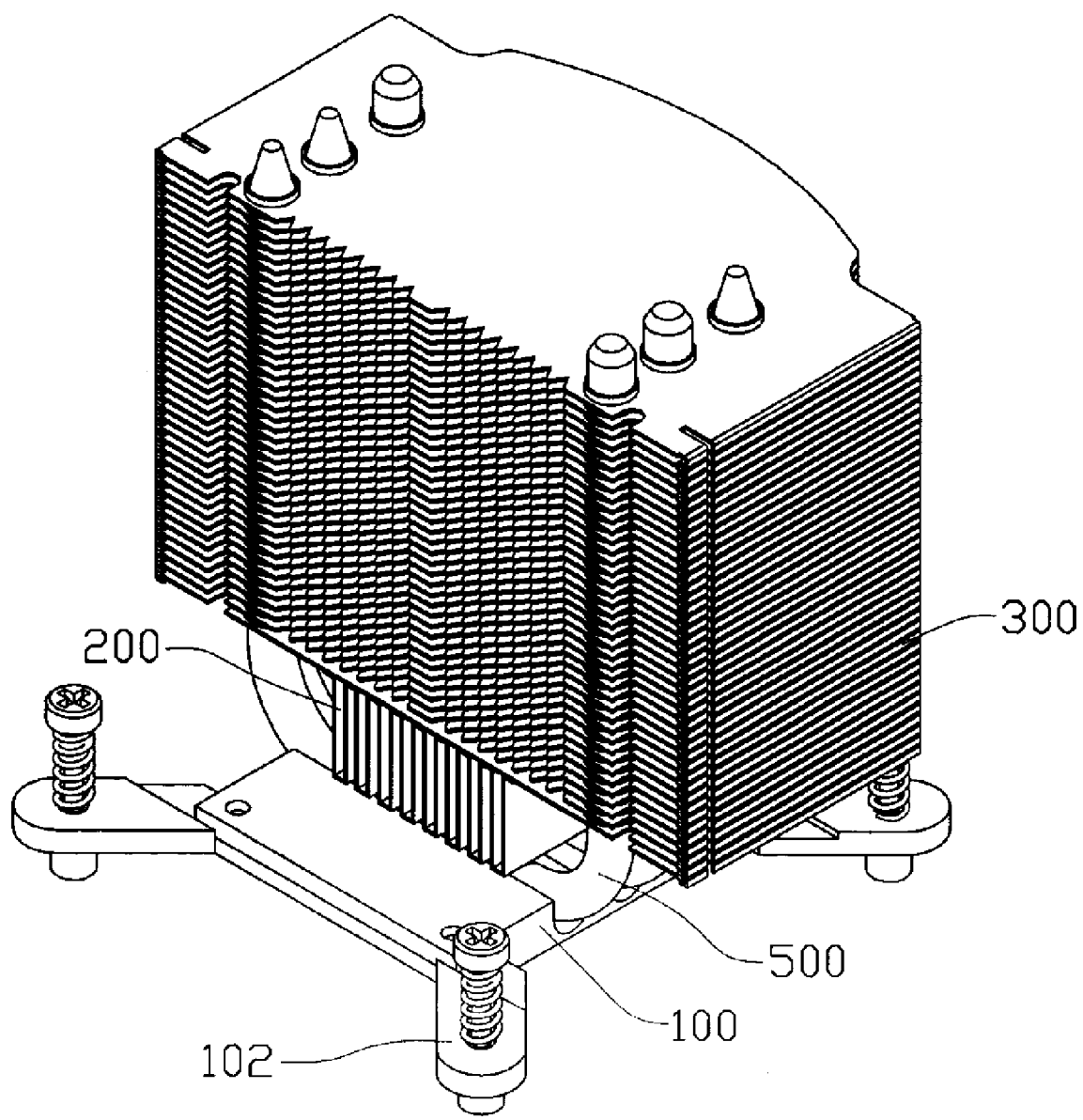
FIG. 6 is similar to FIG. 5, but viewed from another aspect, with a fan removed away.

FIGS. 5-6 show a heat sink in accordance with a second preferred embodiment of the present invention. The heat sink comprises a heat spreader 100 having four ears 102 extending outwardly from four corners thereof, a first fin assembly 200 attached to the heat spreader 100, a second fin assembly 300 mounted on the first fin assembly 200, a fan 400 attached to a rear side of the second fin assembly 300 and three U-shaped heat pipes 500. Each U-shaped heat pipe 500 has a horizontal section sandwiched between the heat spreader 100 and the first fin assembly 200, and two perpendicular sections thermally connected with the second fin assembly 300. The horizontal section is an evaporator for the heat pipe 500 which receives heat from the heat spreader 100, while the two perpendicular sections are condenser for the heat pipe 500, which dissipate the heat to the second fin assembly 300.

Figure 7:
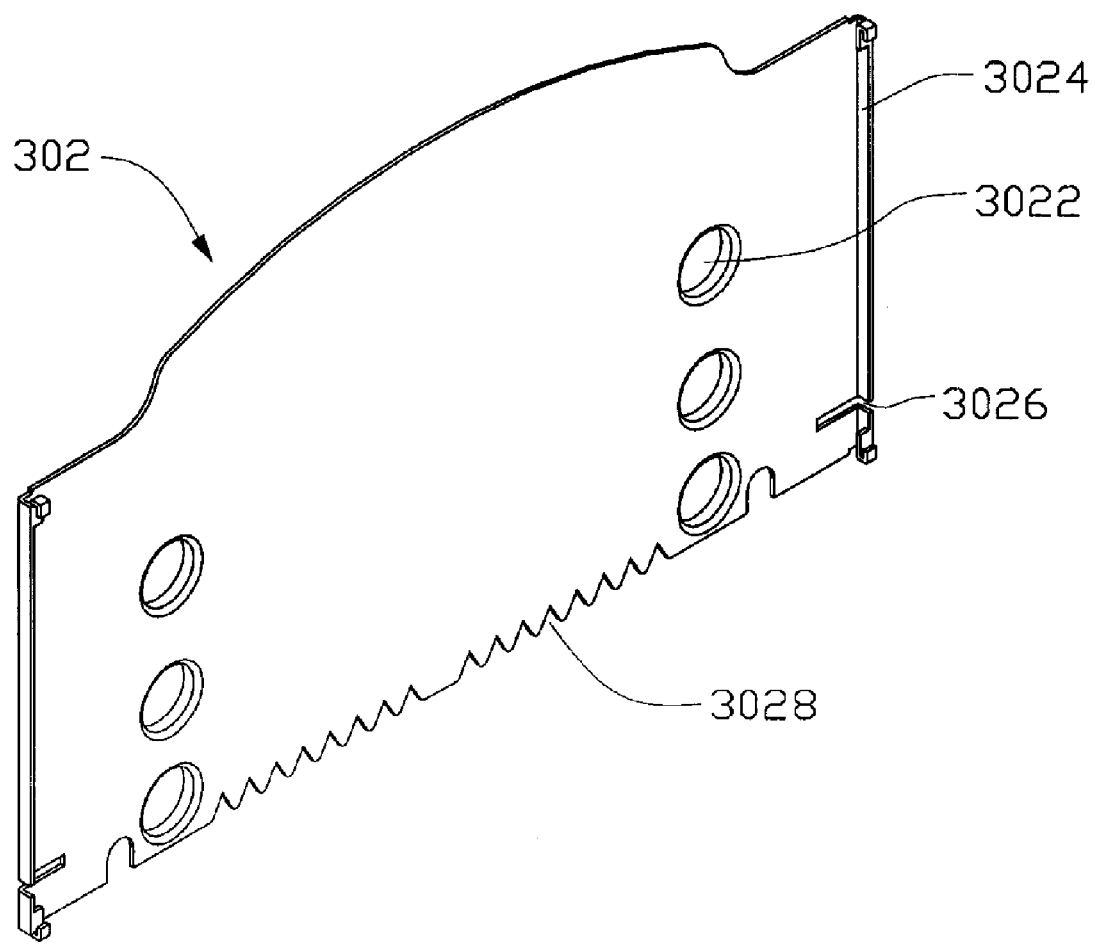
FIG. 7 is an enlarged view of a fin plate of the heat sink of FIG. 6.

The second fin assembly 300 comprises a plurality of fin plates 302 connected with each other. Referring to FIG. 7, each fin plate 302 has a main body with three pairs of holes 3022, a pair of flanges 3024 perpendicularly extending in a same direction from opposite lateral sides of the main body, respectively, and a pair of slots 3026 formed in a rear portion of the two opposite lateral sides of the main body, respectively. When the fin plates 302 are assembled together by being horizontally stacked on each other, the holes 3022 align with each other thereby cooperatively forming three pairs of vertically-extending passages extending through the second fin assembly 300 to receive the perpendicular sections of the U-shaped heat pipes 500, and the slots 3026 also align with each other thereby forming two vertically-extending grooves in the two opposite lateral sides near a rear side of the second fin assembly 300. The grooves engage with a fan holder 600 so that the fan 400 attached to the fan holder 600 is securely mounted at the rear side of the second fin assembly 300. Each fin plate 302 further comprises a plurality of cutouts 3028 defined in a rear edge thereof. The cutouts 3028 of the fin plates 302 cooperatively form a scraggy surface on which the fan 400 is mounted when the fin plates 302 are assembled together. Airflow produced by the fan 400 directly impinges on the scraggy surface and then flows through the second fin assembly 300.

When the heat sink is used to cool down a heat generating component, for example, a CPU, heat produced by the heat generating component is absorbed by the heat spreader 100. Then the heat is quickly transferred to the first and second fin assemblies 200, 300 to be dissipated through the heat spreader 100 and the heat pipes 500. The fan 400 blows airflow toward the scraggy surface of the second fin assembly 300. The velocity of the airflow is disturbed when the airflow impinges on the scraggy surface defined by the cutouts 3028. Therefore, the border layer becomes thin along the direction of airflow thereby enhancing heat transferring between the fin plates 302 and the airflow. The heat dissipation capability of the heat sink is improved.

Figure 8:
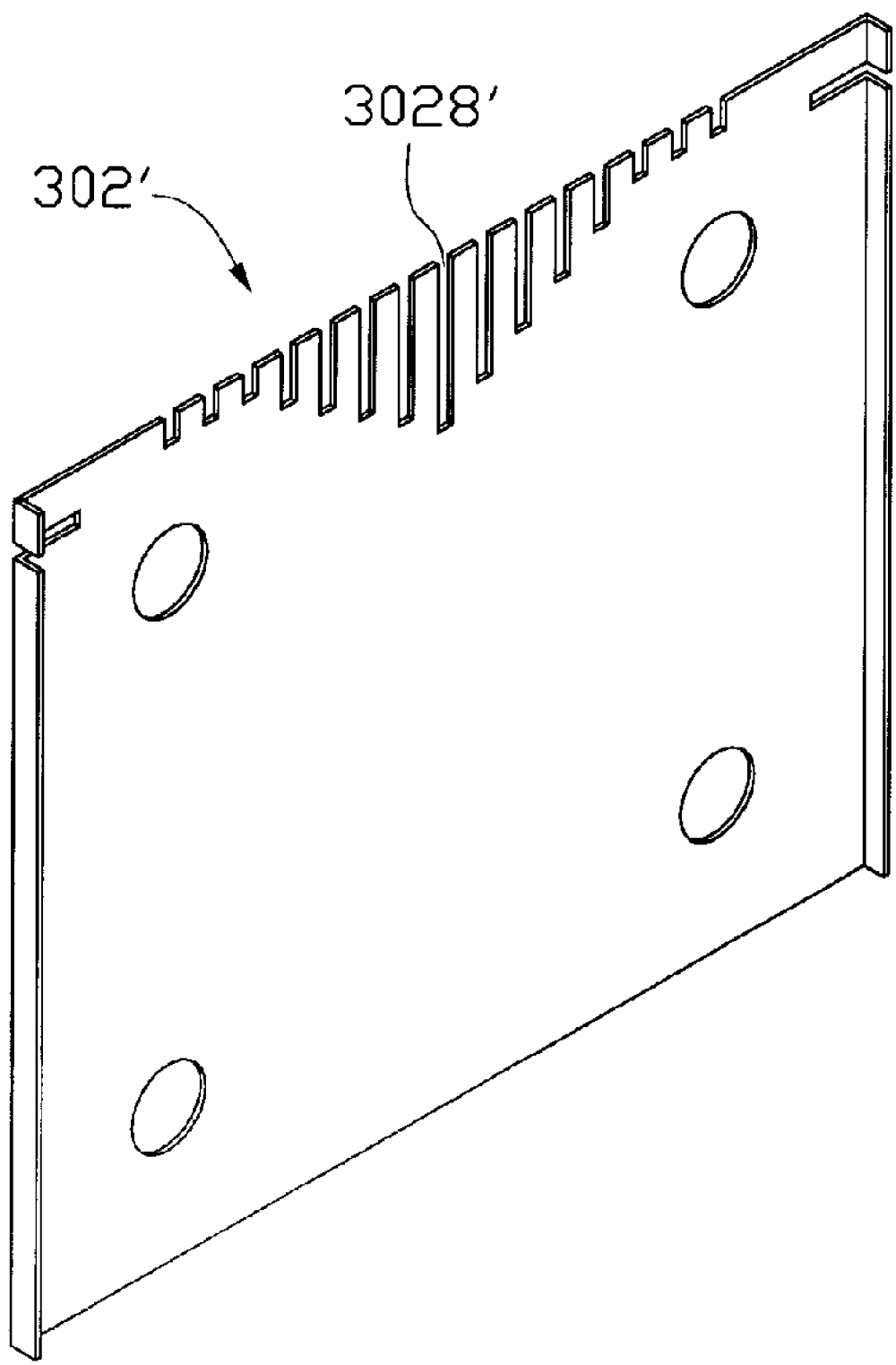
FIG. 8 is an enlarged view of a fin plate for a heat sink in accordance with a third embodiment of the present invention.

FIG. 8 is similar to FIG. 7, and shows an alternative fin plate 302' for a heat sink according to a third embodiment of the present invention. The structure of the fin plate 302' is similar to that of the fin plate 302 as described in the second preferred embodiment. The main difference therebetween is that the cutouts 302' have different depths. The cutouts 3028' are rectangular. The depths of the cutouts 3028' near center of the fin plate 302' are deeper than that of cutouts 3028' away from the center. The depths of the cutouts 3028 gradually increase from the two lateral sides of the fin plate 302' toward the middle thereof. The airflow speed would increase in the center part of the fin assembly, which in turn would enhance heat dissipation. The heat sink according to the third embodiment is similar to the second embodiment; however, only two heat pipes can be used since the fin plate 302' has only two pairs of holes for extending of two pairs of perpendicular sections of the two heat pipe therethrough.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink comprising:
a fin assembly comprising a plurality of fin plates, each fin plate comprising a plurality of cutouts defined on one edge thereof, the cutouts of the fin plates cooperatively forming a scraggy surface when the fin plates are assembled together;
a fan mounted on the scraggy surface of the fin assembly, wherein airflow produced by the fan directly impinges on the scraggy surface thereby enhancing heat transferring between the fin plates and the airflow;
wherein the cutouts have different depths; and
wherein the depths of the cutouts near center of the fin plate are deeper than that away from center of the fin plate.

2. The heat sink as claimed in claim 1, wherein each fin plate further comprises a flange perpendicularly extending from an edge thereof opposite to the cutouts.

3. The heat sink as claimed in claim 2, wherein the flanges of the fin plates are coplanar with each other.

4. The heat sink as claimed in claim 1, wherein each fin plate further comprises a pair of slots formed in opposite sides thereof, wherein the slots align with each other thereby forming two grooves on opposite sides of the fin assembly to engage with a fan holder so that the fan attached to the fan holder is securely mounted on the fin assembly.

5. The heat sink as claimed in claim 1, further comprising a heat conductive member.

6. The heat sink as claimed in claim 5, wherein each fin plate further comprises a hole, the holes aligning with each other thereby cooperatively forming a passage extending through the fin assembly to receive the heat conductive member.

7. The heat sink as claimed in claim 6, wherein the heat conductive member is a heat pipe.

8. A heat sink comprising:
a base for thermally contacting with a heat-generating electronic device;
a plurality of plate-like fins on the base, each of the fins having a side edge cooperating with each other to form a heat-dissipating surface, the side edge defining a plurality of cutouts therein to generate turbulence when an airflow flows through the side edge;
wherein the cutouts each are triangular so that the side edge appears as a sharp-toothed edge.

9. The heat sink of claim 8, further comprising a fan mounted on the heat-dissipating surface of fins.

10. A heat sink comprising:

a base for thermally contacting with a heat-generating electronic device;

a plurality of plate-like fins on the base, each of the fins having a side edge cooperating with each other to form a heat-dissipating surface, the side edge defining a plurality of cutouts therein to generate turbulence when an airflow flows through the side edge;

wherein the cutouts each have a rectangular shape; and wherein the rectangular-shaped cutouts have depths which gradually increase from two sides of each of the fins toward a middle thereof.

11. The heat sink of claim 10, further comprising a fan mounted on the heat-dissipating surface of fins.

* * * * *